US008325714B2

(12) United States Patent
Giorgetta et al.

(10) Patent No.: US 8,325,714 B2
(45) Date of Patent: Dec. 4, 2012

(54) SERIAL-TO-PARALLEL TRANSCEIVER WITH PROGRAMMABLE PARALLEL DATA PATH WIDTH

(75) Inventors: Timothy Eric Giorgetta, San Diego, CA (US); Madjid A. Hamidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1272 days.

(21) Appl. No.: 11/519,549

(22) Filed: Sep. 12, 2006

(65) Prior Publication Data

US 2008/0123721 A1   May 29, 2008

(51) Int. Cl.
H04Q 11/00    (2006.01)
H04B 1/38     (2006.01)
(52) U.S. Cl. ........................ 370/366; 375/219
(58) Field of Classification Search ............... 370/366
See application file for complete search history.

(56) References Cited

U.S. PATENT DOCUMENTS

| 5,426,527 | A  | * | 6/1995 | Steen et al. ............... 398/68 |
| 6,169,501 | B1 | * | 1/2001 | Ryan ......................... 341/101 |
| 6,785,268 | B1 | * | 8/2004 | Tasaki et al. ............... 370/366 |
| 7,253,754 | B2 | * | 8/2007 | Takeuchi et al. ........... 341/100 |
| 7,331,004 | B1 | * | 2/2008 | Porat et al. ................ 714/715 |
| 2005/0265377 | A1 | * | 12/2005 | Mizuno et al. ............ 370/463 |
| 2006/0206637 | A1 | * | 9/2006 | Kimijima .................. 710/36 |

* cited by examiner

*Primary Examiner* — John Blanton
(74) *Attorney, Agent, or Firm* — Kevin T. Cheatham

(57) ABSTRACT

A system and method are provided for programming the parallel path width in a serial-to-parallel path transceiver. Initially, the transceiver is programmed to select a link layer (layer 1) protocol, such as Gigabit Ethernet (GBE) or SONET. The method accepts serial digital data in the selected protocol at a serial interface, and differentiates the serial data into units of i bits per unit. Another programmed selection is made between n number of unique data interfaces, where each interface includes a plurality of parallel paths. The serial digital data is assigned to z selected data interfaces and transmitted. In one aspect, the serial data is assigned to m number of parallel path channels, where m is less than, or equal to z, and less than i. In another aspect, the frequency at which each data interface parallel path transmits data is selected.

20 Claims, 5 Drawing Sheets

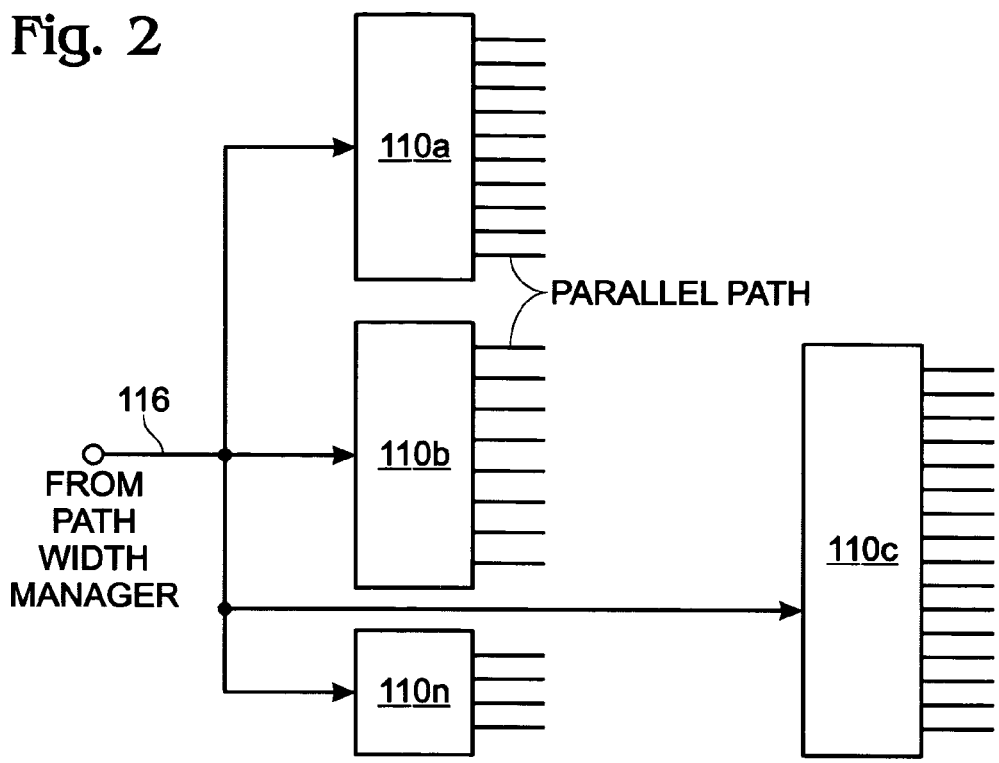
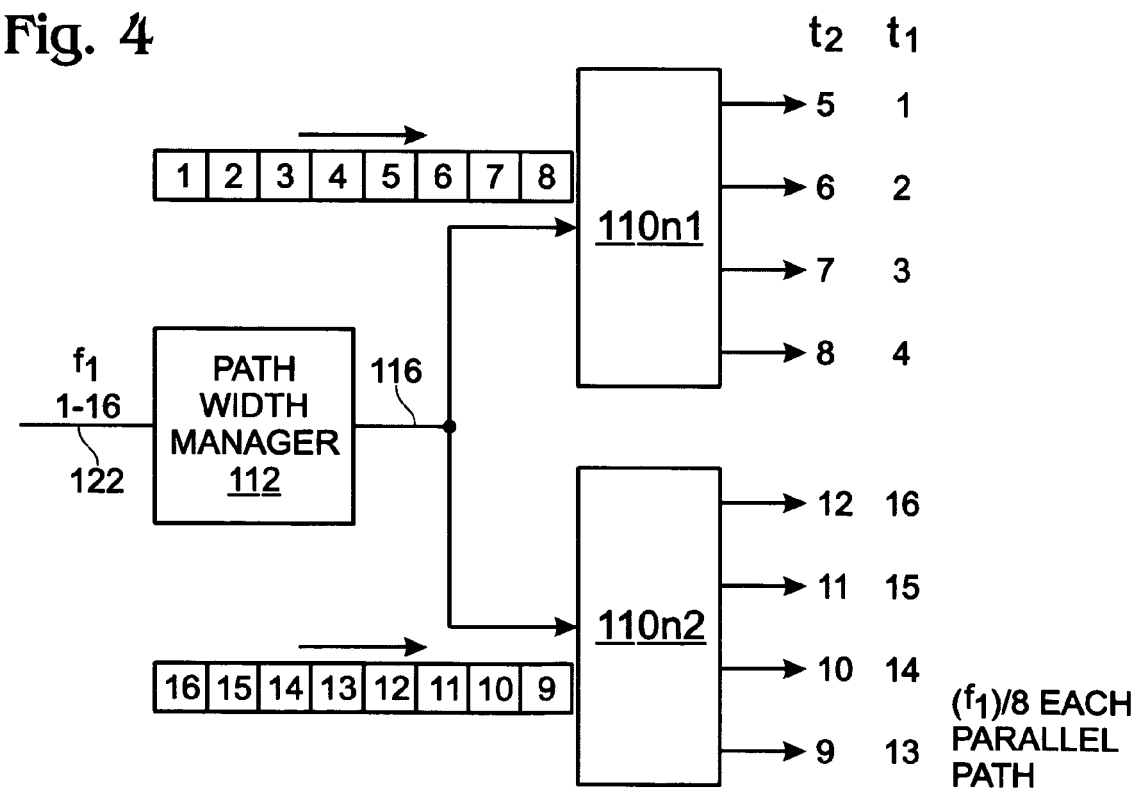

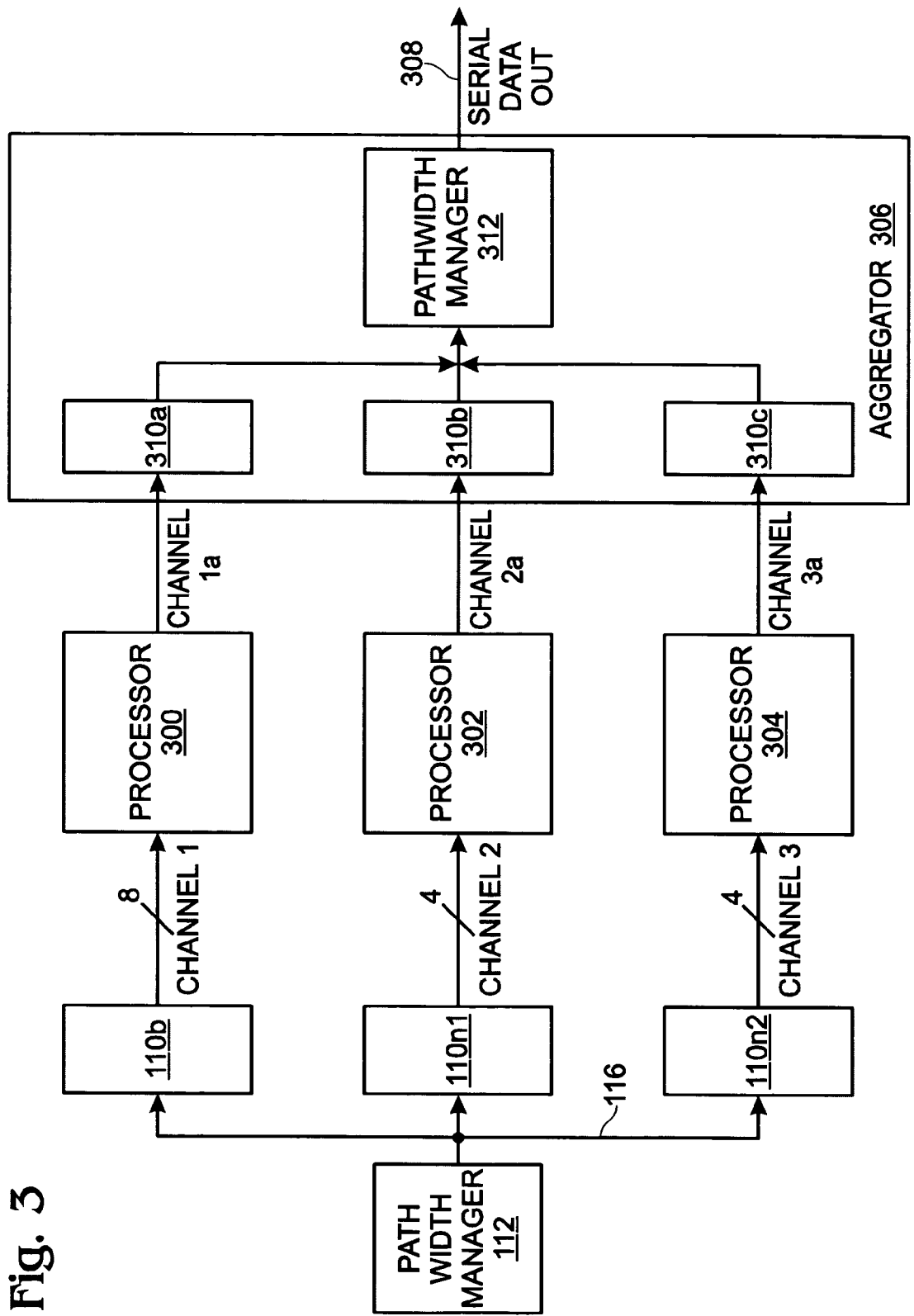

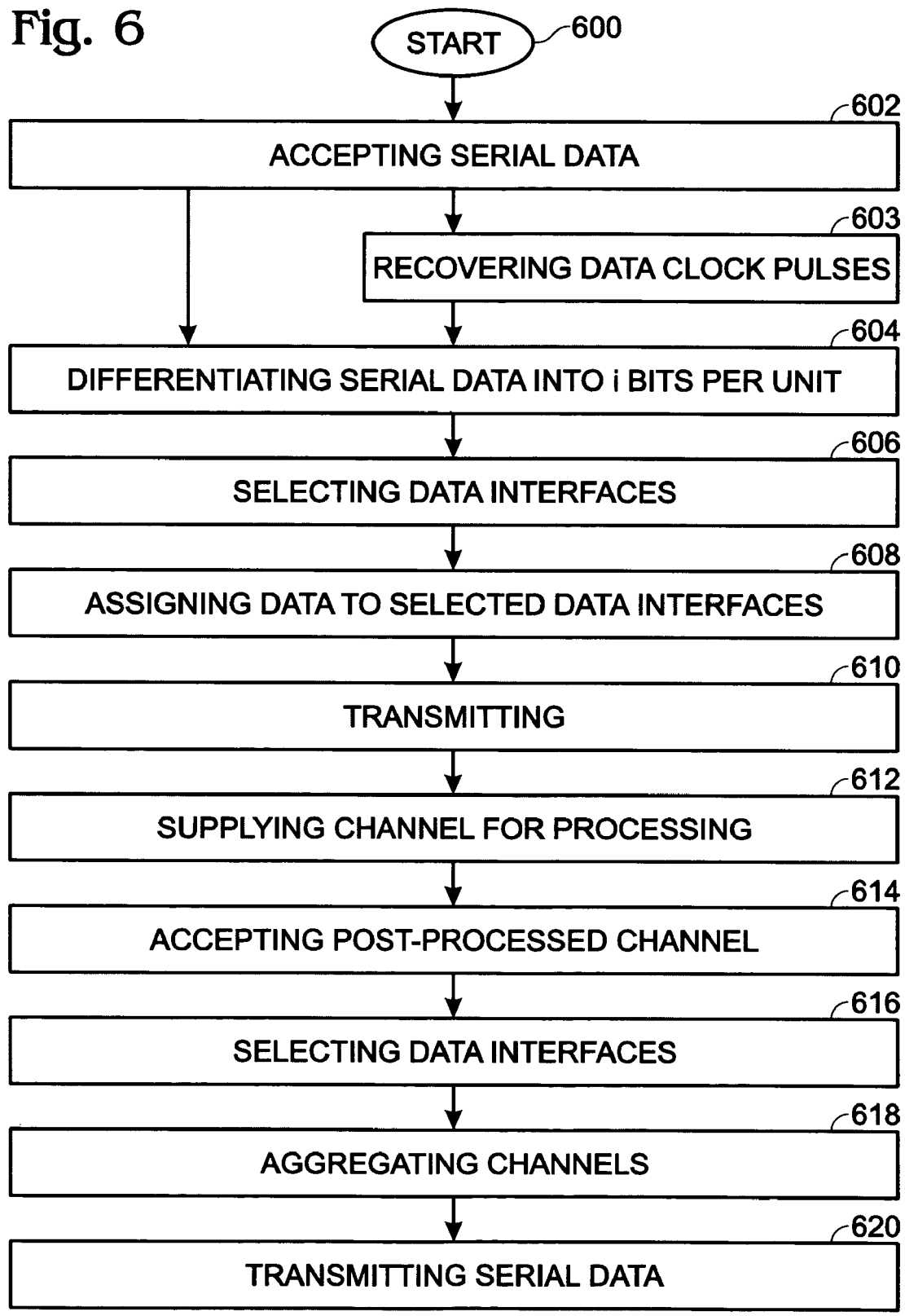

SERIAL-TO-PARALLEL TRANSCEIVER WITH PROGRAMMABLE PARALLEL DATA PATH WIDTH

BACKGROUND OF THE INVENTION

1. Field of the Invention

This invention generally relates to digital communications and, more particularly, to a system and method for programming the parallel data path width in a serial-to-parallel information stream transceiver.

2. Description of the Related Art

In serial data communications, it is conventional to convert a received serial stream of input data into parallel data paths. For example, the serial stream may be synchronous optical network (SONET) data, which is converted into parallel paths for the purpose of deframing or recovering tributaries in the SONET frame. Conventionally, receivers are designed with a fixed number of pins for the parallel data interface. For example, the serial input data may be converted into 4, 8, or 16 parallel paths, corresponding to pins provided by the device manufacturer. Likewise, when the parallel paths are recombined after processing for serial transmission, the transmitting device is typically limited by a fixed number of pins provided for the parallel interface.

It would be advantageous if a serial-to-parallel transceiver, serial-to-parallel receiver, or parallel-to-serial transmitter could be provided with a programmable parallel interface, so as to not be limited by just one or two fixed configuration of parallel paths.

SUMMARY OF THE INVENTION

Accordingly, a method is provided for programming the parallel path width in a serial-to-parallel path transceiver. Initially, the transceiver is programmed to select a link layer (layer 1) protocol, such as Gigabit Ethernet (GBE) or SONET. The method accepts serial digital data in the selected protocol at a serial interface, and differentiates the serial data into units of i bits per unit. Another programmed selection is made between n number of unique data interfaces, where each interface includes a plurality of parallel paths. The serial digital data is assigned to the (z) selected data interfaces, and transmitted.

In one aspect, the serial data is assigned to m number of parallel path channels, where m is less than, or equal to z, and less than i. In another aspect, the frequency at which each data interface parallel path transmits data is selected. In a simple case, the serial digital data is received at a frequency (f1), and the z selected data interfaces have a combined total of t parallel paths. Then, data is transmitted from each parallel path at a frequency (f2) equal to (f1/t). Data is transmitted at either a single data rate (SDR), or a double data rate (DDR), as defined with respect to the serial digital data recovered data clock.

In a redundant channel aspect, the serial digital data is assigned to m number of channels, with i/m=j parallel paths per channel, and the data is transmitted from each parallel path at a frequency (f3) equal to (f1/j). In conjunction, the serial digital data is received in a first order, but may assigned to the selected parallel paths in units of bits having a second order. For example, the bit order of the i received bits may be reversed during assignment to one (or all) of the m channels.

Additional details of the above-described method, and a transceiver with a programmable parallel path width, are provided below.

BRIEF DESCRIPTION OF THE DRAWINGS

FIG. 2 is a schematic block diagram depicting some exemplary data interface variations.

FIG. 3 is a schematic block diagram depicting an example of parallel path channels.

FIG. 4 is a schematic block diagram illustrating transmission frequency selection and bit ordering aspects of the transceiver.

FIG. 6 is a flowchart illustrating a method for programming the parallel path width in a serial-to-parallel path transceiver.

DETAILED DESCRIPTION

Figure 1:
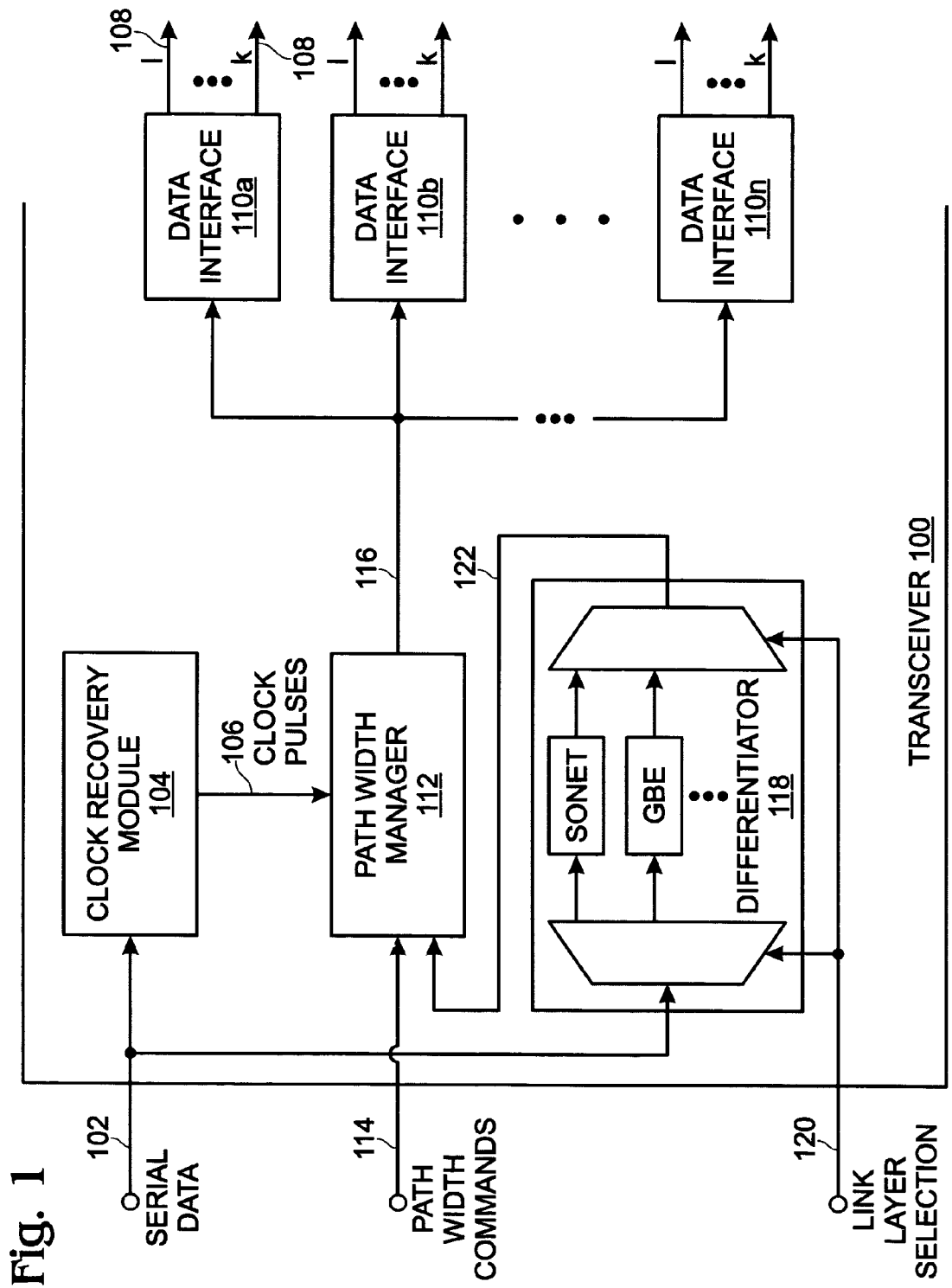
FIG. 1 is a schematic block diagram of a serial-to-parallel path transceiver with a programmable parallel path width.

FIG. 1 is a schematic block diagram of a serial-to-parallel path transceiver with a programmable parallel path width. The transceiver 100 comprises an input serial interface on line 102 for accepting serial digital data. Typically, the serial data is layer 1, Physical layer data, as described in context of the International Organization for Standardization (ISO) 7-layer reference model. For example, the receiver 102 may accept SONET, Gigabit Ethernet (GBE), Fibre Channel (FC), D1 Video, DTV, DV6000-1, HDTV, ESCON/FICON, digitally wrapped data, video, or FDDI, to name a few examples. Further, the input serial stream need not necessarily be limited to layer 1.

Element 100 is referred to herein as a transceiver because it may act as just a receiver, just a transmitter, or as a combination receiver and transmitter. For simplicity, the receive function of the transceiver 100 is initially introduced. As is conventional, a clock recovery module 104 receives the input serial stream on data 102, and supplies a recovered data clock on line 106. The clock recovery module 104 supplies clock pulses recovered from the serial digital data on line 106, where each pulse has a leading edge and a trailing edge.

The transceiver 100 also comprises n number of unique data interfaces 110. Each data interface (110a, 110b, and 110n) includes a plurality of parallel paths 108. As used herein, a parallel path is an individual port, pin, or electrical trace used for transmitting (or receiving) data bits. Therefore, each data interface must necessarily have at least two parallel paths. Although the figure implies that n is equal to 3, the number of data interfaces is not limited to any particular number. As shown, each data interface 110 includes k parallel paths. Again, although the figure implies that k is equal to 2, the number of parallel paths per data interface is not limited to any particular number.

A path width manager 112 has an interface on line 114 for accepting path width commands, and an interface on line 116 for assigning the serial digital data to z selected data interfaces 110, where z≦n. The selected data interface, or data interfaces, transmits the assigned data. The path width manager 112 may assigns data to the selected data interface at a single data rate (SDR), responsive to either the leading or trailing pulse edges supplied by clock recovery unit 106, or at a double data rate (DDR), responsive to both the leading and trailing pulses edges.

Further, the transceiver 100 may further comprise a protocol differentiator 118 having an input on line 102 to accept the serial data, a programming interface on line 120 to accept commands for selecting a link layer (layer 1) protocol, and an output on line 122 for supplying serial data differentiated into units of i bits per unit, in response to the selected protocol. For example, each unit may consist of 16 bits (i=16).

FIG. 2 is a schematic block diagram depicting some exemplary data interface variations. Data interface 110a is shown with parallel paths, data interface 110b is shown with 8 parallel paths, data interface 110c is shown with 16 parallel paths, and data interface 110n is shown with 4 parallel paths. The number of parallel paths per data interface is not necessarily limited to any particular number. Likewise, the data interfaces need not necessary have a different number of parallel paths. For example, the transceiver may have two 8-bit data interfaces.

FIG. 3 is a schematic block diagram depicting an example of parallel path channels. Generally, the path width manager 112 forms m number of parallel path channels in the z selected data interfaces, where m is less than, or equal to z, and less than i. As shown in this example, m is equal to 3, and i continues to be equal to 16. In this example, channel 1 is formed from the 8-bit data interface 110b, channel 2 is formed from the 4-bit data interface 110n1, and channel 3 is formed from the 4-bit data interface 110n2.

A channel is a combination of parallel paths including data devoted to a common or related function. As shown, channel 1 may be a video channel, while channel 2 is a voice (audio) channel, and channel 3 is a 4-bit wide redundant version of the video channel transmitting at twice the rate of channel 1. The path width manager 112 may select the frequency at which each parallel path transmits data.

To further illustrate the channel concept, processors 300, 302, and 304 are shown. In other aspects (not shown), the channels may interface with processors located external to the transceiver. The processors supply post-processed parallel path channels 1a, 2a, and 3a.

As noted above, the transceiver may perform a transmit function. Here, an aggregator 306 is shown having selectable data interfaces to accept the m (3) parallel path channels, and a serial output interface on line 308 to transmit the aggregated m parallel path channels as a serial data. The aggregator 306 can be thought of as the inverse of the receiver-associated elements introduced in FIG. 1, with data interfaces 310a, 310b, and 310c, and a path width manager 312 using the selected data interfaces to combine the 3 channels, and transmit the aggregated channels as a serial data stream.

The elements of FIGS. 1 and 3 show a unidirectional data flow form the left, to the right hand side of the page. Alternately but not shown, the transceiver may support a bidirectional flow of data.

FIG. 4 is a schematic block diagram illustrating transmission frequency selection and bit ordering aspects of the transceiver. First, the path width manager 112 may select the frequency at which each parallel path transmits data. Second, the path width manager 112 may change the order of the received bits. In this example, the input serial interface accepts serial digital data at a frequency (f1). Again, it is assumed that the serial data is differentiated into units of i bits per unit, where i=16.

Generally, the path width manager 112 assigns the accepted serial data to z selected data interfaces with a combined total of t parallel paths, where t≦i, and selects a transmission frequency (f2) for each parallel path equal to (f1/t). In the simple case (not shown), t=i, and f2=f1/16.

As shown in FIG. 4, t=8. Bits 1-16 from each unit of serial input are divided between data interfaces 110n1 and 110n2, both of which have 4 parallel paths. To accomplish this task, data is transmitted from each at the rate f2=(f1/8). Assuming that the bits are received at the serial interface in a first order of 1, 2, 3, ... 16, data interface 110n1 can be said to retain the first order by first transmitting bits 1-4 in parallel (at t1), followed by the parallel transmission of bits 5-8 (at t2). To illustrate the point that the bit order may be rearranged, here the path width manager 112 assigns data to data interface 110n2 in units of bits having a second order. That is, data interface 110n2 transmits bits 16-13 in parallel (at t1), followed by the parallel transmission of bits 12-9 (at t2).

In another example not shown, the path width manager may select a frequency for transmission via the parallel paths that is faster (in combination) than the rate at which the serial bits are received. In this scenario, there are "gaps" in the transmitted data, which may be no data, "dummy" data (e.g., "0"s), or data that is received via another input channel (not shown) and combined with the serial input data. In another example not shown, the path width manager may select parallel path transmission frequencies that are slower (in combination) than the serial input rate, in which case some of the input data is dropped. While the discussion of FIG. 4 has focused on the selectable transmission frequency aspect of the device, it should be understood that this feature applies equally well on the receive side, for example, in the selection of frequencies at which the various aggregator data interfaces receive data (see FIG. 3).

Figure 5:
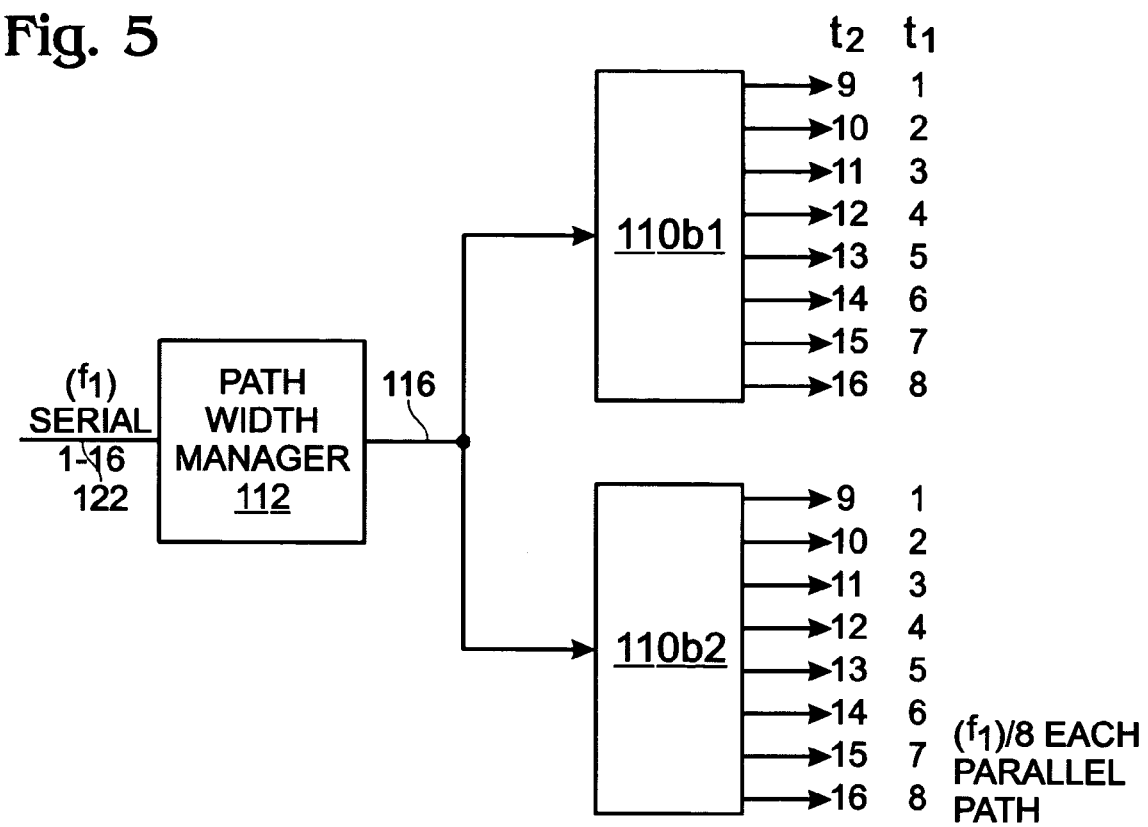
FIG. 5 is a schematic block diagram illustrating a redundant channel aspect of the transceiver.

FIG. 5 is a schematic block diagram illustrating a redundant channel aspect of the transceiver. Again, it is assumed that the input serial interface accepts data in units of i bits per unit (i=16), at a frequency (f1). Here, the path width manager 112 forms m number of channels, with i/m=j parallel paths per channel. (m−1) of the channels may be considered as redundant. The path width manager selects a frequency (f3) for transmitting from each parallel path equal to (f1)/j. As shown, m=2 channels, with 16/2=8 parallel paths per channel. Thus, f3=(f1)/8.

Note the (redundant) data interfaces need not necessarily have the same number of parallel paths. Alternately but not shown, 16-bit data units may be transmitted via an 8-bit data interface, at a rate of (f1)/8, and redundantly transmitted via a 4-bit data interface at a rate of (f1)/4.

Note, although the above-described transceiver elements have been explained and depicted as hardware, some portions of these transceiver elements may be enabled as software instructions stored in memory, and operated on by a microprocessor.

Functional Description

FIG. 6 is a flowchart illustrating a method for programming the parallel path width in a serial-to-parallel path transceiver. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 600.

Step 600 accepts serial digital data at a serial interface. Step 602 selects a link layer (layer 1) protocol. Step 604 differentiates the serial data into units of i bits per unit, in response to the selected protocol. Step 606 selects between n number of unique data interfaces, where each interface includes a plurality of parallel paths. Step 608 assigns the accepted serial digital data to z selected data interfaces, where z≦n. In one aspect, assigning the accepted serial data to z selected data interfaces in Step 608 includes forming m number of parallel path channels, where m is less than, or equal to z, and less than i. Step 610 transmits the assigned data.

In another aspect, Step 612 supplies at least one parallel path channel for processing. Step 614 accepts a post-processed parallel path channel. On the transmit side, Step 616 selects between n number of unique data interfaces, where each interface includes a plurality of parallel paths. Step 618 aggregates the m parallel path channels via z selected data interfaces. Step 620 transmits the aggregated m parallel path channels as a serial data.

In a different aspect, assigning serial data to the selected data interface in Step 608 include selecting the frequency at which each data interface parallel path transmits data. For example, if Step 602 accepts serial digital data at a frequency (f1), then assigning the accepted serial data to z selected data interfaces in Step 608 includes assigning the accepted serial data to z data interfaces with a combined total of t parallel paths, where $t \leq i$. Step 610 transmits data from each parallel path at a frequency (f2) equal to (f1/t).

In a redundant channel example, Step 602 accepts serial digital data at a frequency (f1), and Step 608 forms m number of channels, with i/m=j parallel paths per channel. Then, Step 610 transmits data from each parallel path at a frequency (f3) equal to (f1/j).

In another aspect, Step 603 recovers data clock pulses, each pulse having a leading edge and a trailing edge, in response to receiving the serial digital data. Then, Step 610 transmits assigned data at either a single data rate (SDR), responsive to a either the leading or trailing pulse edge, or at a double data rate (DDR), responsive to both the leading and trailing pulses edges.

In a different aspect, Step 602 accepts serial data in units of bits having a first order, and assigning the accepted serial digital data to the selected parallel path interface in Step 608 includes assigning data to the selected data interface in units of bits having a second order, different than the first order.

A system and method have been provided for programming the parallel path with in a serial-to-parallel transceiver. Some examples of specific data interfaces and path width examples have been given. However, the invention is not limited to merely these examples. Other variations and embodiments of the invention will occur to those skilled in the art.

We claim:

1. A serial-to-parallel transceiver comprising:
    a differentiator configured to logically group a serial data stream into i bit units of serial data based on a selected protocol; and
    a path width manager configured to:
        programmably select a number of logical parallel width channels of information in response to at least one of a predetermined channel selection rate and a frequency selection rate;
        programmably form a sequence of serial data based on the selected number of logical parallel width channels of information by combining one or more of the i bit units of serial data from the differentiator; and
        programmably select a subset of data interfaces to transmit the sequence of serial data.

2. The serial-to-parallel transceiver of claim 1, further comprising a clock recovery module configured to:
    generate data clock pulses derived from the serial data stream; and
    supply the data clock pulses to the path width manager.

3. The serial-to-parallel transceiver of claim 2, wherein the path width manager uses the data clock pulses to programmably form the sequence of serial data.

4. The serial-to-parallel transceiver of claim 1, wherein the selected subset of data interfaces together convert the sequence of serial data into a subset of plural channels of parallel data.

5. The serial-to-parallel transceiver of claim 1, wherein at least one channel of parallel data output from a first data interface has a different width than a channel of parallel data output from a second interface of the subset data interfaces.

6. A device including a serial-to-parallel transceiver comprising:
    means for logically grouping a serial data stream into i bit units of serial data based on a selected protocol;
    means for programmably selecting a number of logical parallel width channels of information in response to at least one of a predetermined channel selection rate and a frequency selection rate;
    means for programmably forming a sequence of serial data based on the selected number of logical parallel width channels of information by combining one or more of the i bit units of serial data; and
    means for programmably selecting a subset of data interfaces to transmit the sequence of serial data.

7. The device of claim 6, further comprising:
    means for generating data clock pulses derived from the serial data stream; and
    means for supplying the data clock pulses to the path width manager.

8. The device of claim 7, wherein the path width manager uses the data clock pulses to programmably form the sequence of serial data.

9. The device of claim 6, wherein the selected subset of data interfaces together convert the sequence of serial data into a subset of plural channels of parallel data.

10. The device of claim 6, wherein at least one channel of parallel data output from a first data interface has a different width than a channel of parallel data output from a second interface of the subset data interfaces.

11. A method for serial-to-parallel conversion comprising:
    logically grouping a serial data stream into i bit units of serial data based on a selected protocol;
    programmably selecting a number of logical parallel width channels of information in response to at least one of a predetermined channel selection rate and a frequency selection rate;
    programmably forming a sequence of serial data based on the selected number of logical parallel width channels of information by combining one or more of the i bit units of serial data; and
    programmably selecting a subset of data interfaces to transmit the sequence of serial data.

12. The method of claim 11, further comprising:
    generating data clock pulses derived from the serial data stream; and
    supplying the data clock pulses to the path width manager.

13. The method of claim 12, wherein the path width manager uses the data clock pulses to programmably form the sequence of serial data.

14. The method of claim 11, wherein the selected subset of data interfaces together convert the sequence of serial data into a subset of plural channels of parallel data.

15. The method of claim 11, wherein at least one channel of parallel data output from a first data interface has a different width than a channel of parallel data output from a second interface of the subset data interfaces.

16. A non-transitory computer-readable medium storing instructions that, when executed by a processor, cause the processor to:
    logically group a serial data stream into i bit units of serial data based on a selected protocol;

programmably select a number of logical parallel width channels of information in response to at least one of a predetermined channel selection rate and a frequency selection rate;

programmably form a sequence of serial data based on the selected number of logical parallel width channels of information by combining one or more of the i bit units of serial data; and programmably select a subset of data interfaces to transmit the sequence of serial data.

17. The non-transitory computer-readable medium of claim 16, further storing instructions that, when executed by the processor, cause the processor to:

generate data clock pulses derived from the serial data stream; and supply the data clock pulses to the path width manager.

18. The non-transitory computer-readable medium of claim 17, wherein the sequence of serial data is programmably formed using the data clock pulses.

19. The non-transitory computer-readable medium of claim 16, wherein the selected subset of data interfaces together convert the sequence of serial data into a subset of plural channels of parallel data.

20. The non-transitory computer-readable medium of claim 16, wherein at least one channel of parallel data output from a first data interface has a different width than a channel of parallel data output from a second interface of the subset data interfaces.

* * * * *